(12) United States Patent
Mizuno et al.

(10) Patent No.: US 8,399,832 B2
(45) Date of Patent: Mar. 19, 2013

(54) SCANNING ELECTRON MICROSCOPE AND CD MEASUREMENT CALIBRATION STANDARD SPECIMEN

(75) Inventors: Takeshi Mizuno, Hitachi (JP); Hiroki Kawada, Tsuchiura (JP)

(73) Assignee: Hitachi High-Technologies, Tokyo (JP)

( * ) Notice: Subject to any disclaimer, the term of this patent is extended or adjusted under 35 U.S.C. 154(b) by 586 days.

(21) Appl. No.: 12/216,136

(22) Filed: Jun. 30, 2008

(65) Prior Publication Data

US 2008/0272297 A1    Nov. 6, 2008

Related U.S. Application Data

(60) Continuation of application No. 11/902,559, filed on Sep. 24, 2007, now Pat. No. 7,420,168, which is a division of application No. 11/165,223, filed on Jun. 24, 2005, now Pat. No. 7,361,898.

(30) Foreign Application Priority Data

Jun. 25, 2004   (JP) .................................. 2004-188495

(51) Int. Cl.
    *G01N 23/04*    (2006.01)
(52) U.S. Cl. .......................... 250/307; 250/310; 250/311
(58) Field of Classification Search .................... 250/307
    See application file for complete search history.

(56) References Cited

U.S. PATENT DOCUMENTS

| | | | |
|---|---|---|---|
| 5,849,441 A | 12/1998 | Nara et al. | |
| 6,768,958 B2 * | 7/2004 | Ivanovic et al. | 702/94 |
| 6,919,577 B2 | 7/2005 | Watanabe et al. | |
| 6,970,231 B2 * | 11/2005 | Tanaka | 355/53 |
| 6,972,405 B2 | 12/2005 | Nagakubo et al. | |
| 7,078,691 B2 | 7/2006 | Nakayama | |
| 7,102,243 B2 * | 9/2006 | Koike et al. | 257/797 |
| 7,329,889 B2 | 2/2008 | Watanabe et al. | |
| 2005/0184234 A1 | 8/2005 | Nakayama | |
| 2006/0289756 A1 | 12/2006 | Nakayama | |

FOREIGN PATENT DOCUMENTS

| | | |
|---|---|---|
| JP | 01-187409 | 7/1989 |
| JP | 7-71947 | 3/1995 |
| JP | 08-31363 | 2/1996 |
| JP | 09-275074 | 10/1997 |
| JP | 2003-279321 | 10/2003 |
| JP | 2003-279321 A | 10/2003 |
| JP | 2004-177149 | 6/2004 |

OTHER PUBLICATIONS

Japanese Office Action issued in Japanese Patent Application No. JP 2004-188495 dated Oct. 31, 2008.

\* cited by examiner

*Primary Examiner* — Phillip A Johnston (57) ABSTRACT

A calibration standard specimen is provided to have formed therein calibrating patterns of a lattice shape discontinuously arrayed, and particular alignment patterns respectively disposed near the calibrating patterns so that the positioning of the specimen can be made to match the calibrating patterns to the measurement points.

12 Claims, 5 Drawing Sheets

| STANDARD SPECIMEN ID | POPULATION VARIANCE | | USED PATTERNS | |
|---|---|---|---|---|
| | LONGITUDINAL | LATERAL | LONGITUDINAL | LATERAL |
| | | | | |
| | | | | |
| | | | | |
| | | | | |
| | | | | |
| | | | | |

FIG.7

STANDARD SPECIMEN ID ☐

CALIBRATION ACCURACY ☐

SCANNING ELECTRON MICROSCOPE AND CD MEASUREMENT CALIBRATION STANDARD SPECIMEN

RELATED APPLICATIONS

This application is a Continuation of U.S. application Ser. No. 11/902,559, filed Sep. 24, 2007, now U.S. Pat. No. 7,420,168, which is a Divisional of U.S. application Ser. No. 11/165,223, filed Jun. 24, 2005, now U.S. Pat. No. 7,361,898, and claims priority of Japanese Application No. 2004-188495, filed Jun. 25, 2004, the entire contents of each of which are hereby incorporated by reference.

BACKGROUND OF THE INVENTION

The present invention relates to scanning electron microscopes and CD measurement calibration standard specimens, and particularly to a scanning electron microscope and CD measurement calibration standard specimen suited to measure dimensions of fine patterns that are formed exposed on a semiconductor wafer.

Recently, the dimensional accuracy of patterns formed on a semiconductor wafer has been reduced up to less than 100 nm, and the scanning electron microscope has been generally used as a pattern-dimension managing tool. There are various different needs for the performance of the apparatus, and the chief ones will be improvements in resolution/static repeatability accuracy, and dimension-measurement calibration precision. The demanded dimension-measurement calibration precision is one nm or below. Under these circumstances, an example of dimension-measurement calibrating members is described as a dimension-measurement calibration standard specimen in JP-A-7-071947. In addition, another example of the dimension-measurement calibration standard specimen is disclosed in JP-A-8-031363. Moreover, an example of the critical dimension (CD) measurement calibration second-standard specimen is given in JP-A-2003-279321.

SUMMARY OF THE INVENTION

However, the dimension-measurement calibration standard specimens for the scanning electron microscope disclosed in JP-A-7-071947 and JP-A-8-031363 have the problem that even if the dimension-measurement calibrating patterns can be automatically addressed, it is difficult for the pattern of interest to be again called out at hand because the patterns are a continuous lattice pattern. In other words, the dimension measurement calibration at any position cannot be made on a calibrating pattern at the same corresponding position. Although a searching guide is provided as in JP-A-2003-279321 so that the line pattern pitch can be easily searched for, it is located above the line pattern as a function to easily confirm the traceability chain, or traceability chain confirming alphanumeric characters are simply added so that they can be visually confirmed with a magnification for optical microscope. In addition, the function to automatically specify the measurement point is not provided.

An object of the invention is to provide a scanning electron microscope and dimension-measurement calibration standard specimen with the above problems solved, capable of positioning the specimen to match the measurement point so that the corresponding calibrating pattern can be called out that was difficult in the prior art.

In order to achieve the above object, the present invention proposes a scanning electron microscope that measures dimensions of fine patterns formed exposed on a semiconductor wafer, wherein a calibration standard specimen is used that has a plurality of dimension-measurement calibrating patterns discontinuously arrayed, and alignment patterns formed for use in positioning the specimen to match the measurement point. The plurality of calibrating patterns are formed of a plurality of line-and-space patterns discontinuously arrayed in a first direction and a plurality of lined-and-space patterns discontinuously arrayed in a second direction perpendicular to the first direction. The alignment patterns are formed of combinations of patterns of at least four kinds different in their shapes and arrayed such that the alignment patterns of the same shape are not adjacent to each other.

According to the invention, since the scanning electron microscope has a dimension-measurement calibration standard specimen that has formed therein a plurality of calibrating patterns discontinuously arrayed and alignment patterns provided for positioning the specimen to match the measurement point, the specimen can be positioned to match the measurement point at which the corresponding calibrating pattern can be called out, and thus the dimension-measurement calibration at the same position can be performed. Therefore, the long-term stability of the single apparatus can be quantitatively evaluated. In addition, the machine matching between multiple apparatuses can be quantitatively evaluated by using the same calibration standard specimen and the same calibrating pattern.

Other objects, features and advantages of the invention will become apparent from the following description of the embodiments of the invention taken in conjunction with the accompanying drawings.

DESCRIPTION OF THE EMBODIMENT

An embodiment of the invention will be described with reference to the accompanying drawings.

Figure 1:
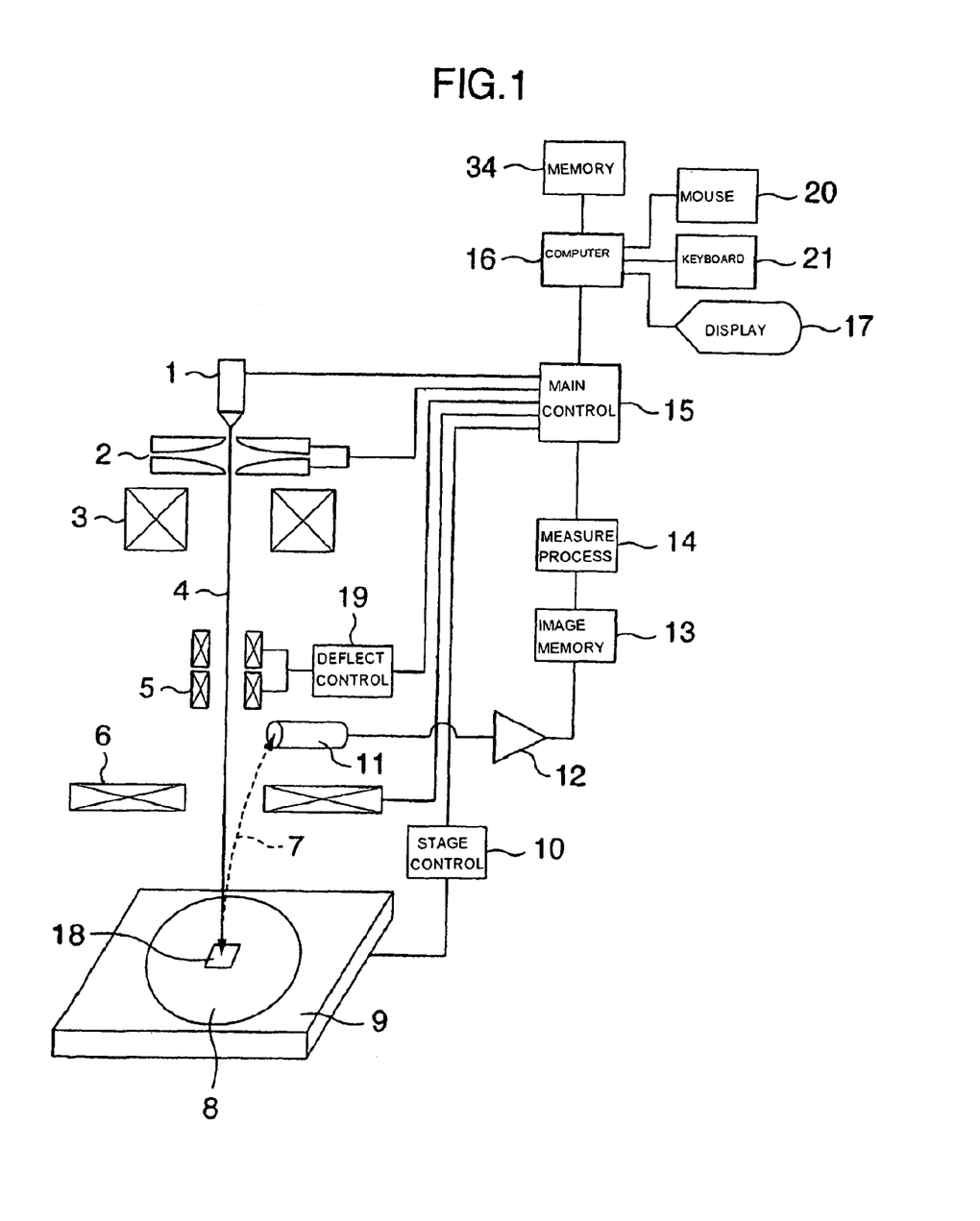
FIG. 1 is a diagram useful for explaining the basic construction of the scanning electron microscope.

FIG. 1 is a diagram useful for explaining the basic construction of a scanning electron microscope according to the invention. A primary electron beam 4 emitted from an electron gun 1 is controlled/accelerated by an anode 2, and focused/irradiated by a condenser lens 3 and objective lens 6 onto a sample such as a semiconductor wafer or the like that has patterns formed to be measured and that is placed on a sample stage 9. A main controller 15 controls these elements to make the above operations. In the path of the primary electron beam 4, a deflector 5 is also provided and supplied with a deflecting current from a deflection controller 19. The deflecting current is changed according to the magnification that is arbitrarily set by a mouse 20 or keyboard 21 connected to a computer 16. Thus, the primary electron beam 4 is deflected by the deflector 5 to scan the surface of the sample in a two-dimensional manner. As to the movement of the sample to the measurement point, a stage controller 10 controls the sample stage 9 so that the sample can be moved to an arbitrary position for the measurement point. In addition, a template image is previously registered in the computer 16 to make template matching for the positioning of the sample to the measurement point. Therefore, an arbitrary measurement point present on the sample can be caused to come up at hand. The secondary electrons, 7 caused by the irradiation of the primary electron beam 4 onto the sample are detected by a secondary electron detector 11, amplified by an amplifier 12 and stored in an image memory 13. Then, a measurement processor 14 measures the dimensions of the pattern according to the stored image. In addition, the image signal generated at this time is displayed on a display device 17.

When the scanning electron microscope is calibrated for the measurement of pattern's dimensions, a dimension-measurement calibration standard specimen 8 is placed and measured on the sample stage 9 in place of the normal sample. At this time, the template image registered in the computer 16 is used to make template matching for the positioning of the specimen to the measurement point. Therefore, a calibrating pattern 18 formed on the specimen 8 can be moved to an arbitrary measurement point. The secondary electrons 7 generated by the irradiation of electron beam onto the calibration standard specimen 8 is detected by the secondary electron detector 11, amplified by the amplifier 12 and stored in the image memory 13. The measurement processor 14 measures the dimensions of the pattern by using the stored image. The image signal generated at this time is displayed on the display device 17. The scanning electron microscope is calibrated for the measurement of dimensions by controlling the deflecting current and the magnification coefficient in the measurement processor 14. A memory 34 holds information of the calibration standard specimen 8.

Figure 2A:
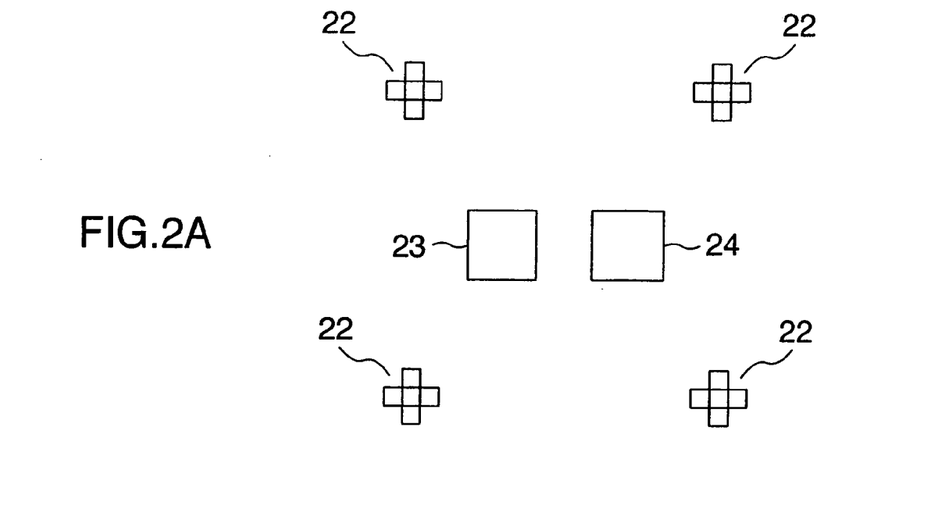
FIGS. 2A through 2C are diagrams useful for explaining the construction of the calibration standard specimen.
Figure 2B:
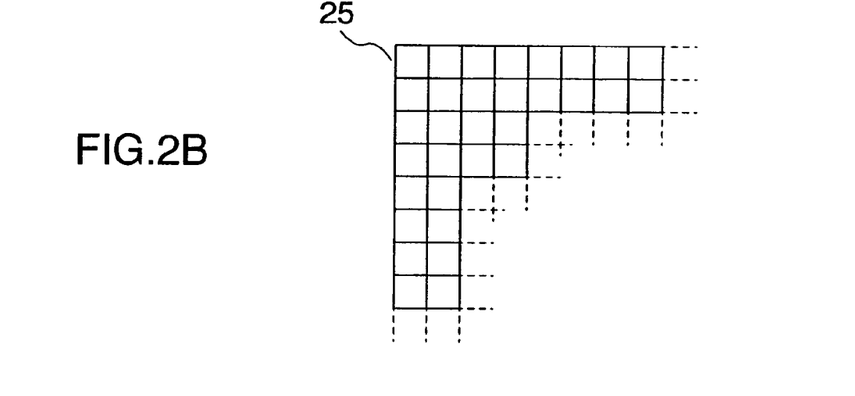
Figure 2C:
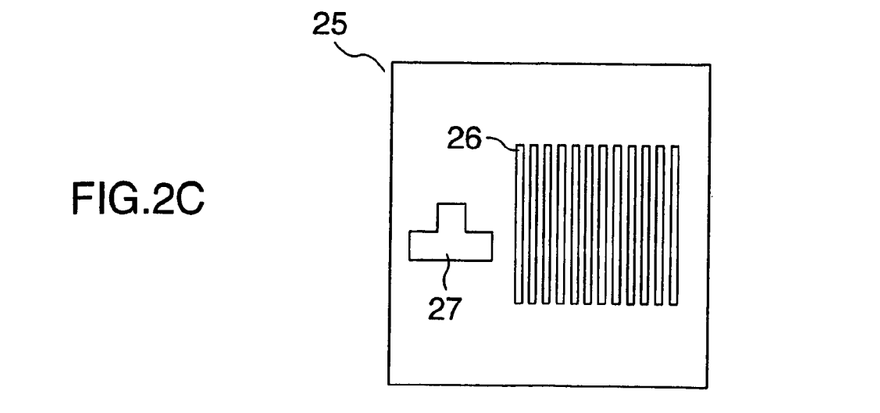

The construction of the calibration standard specimen 8 will be described with reference to FIGS. 2A through 2C. The calibration standard specimen 8 takes a form of semiconductor wafer. As shown in FIG. 2A, it has a longitudinal pattern region 23 and a lateral pattern region 24 provided at around the center. The longitudinal pattern region 23 has a plurality of calibrating pattern sections 25 arrayed in a two-dimensional manner as shown in a magnified view of FIG. 2B. Each calibrating pattern section 25 includes a longitudinal line-and-space pattern 26 formed of stripes of several microns μm as shown in FIG. 2C. Therefore, the calibration standard specimen 8 has a plurality of line-and-space patterns 26 formed discontinuously. The stripes of line-and-space pattern 26 are formed at a pitch of about 100 nm. The lateral pattern region 24 similarly has a plurality of calibrating pattern sections arrayed in a two-dimensional manner. Each calibrating pattern section has a lateral line-and-space pattern of stripes of several microns μm that are formed at a pitch of about 100 nm.

The calibration standard specimen 8 also has global alignment purpose marks 22 formed for the translational and rotational alignment (global alignment). An alignment pattern 27 is also provided near the line-and-space pattern 26.

According to the construction of the specimen, since the calibrating patterns are arrayed discontinuously, the measurement position can be clearly grasped, and thus the measurement at the same position can be calibrated. The calibration standard specimen 8 may be produced as a chip attached onto a specimen stub after a semiconductor wafer is diced into chips.

The alignment pattern will be described next. The calibrating pattern 18 of the calibration standard specimen 8 placed on the sample stage 9 is positioned to appear as the stage controller 10 controls the sample stage 9 to move. Since the positioning precision of the sample stage 9 is generally a few microns μm, the final positioning of the pattern to the measurement point is performed as follows. An image portion (template image) including a characteristic pattern as a guide is previously registered in the computer 16, and it is used to make template matching by which the pattern position is detected, so that the pattern can be precisely positioned to the measurement point according to the distance from the pattern position. The line-and-space patterns 26 alone could not be distinguished from their adjacent ones because the patterns of the same shape would be present in a plural form and thus look similar. According to the invention, the alignment pattern is provided as the template image near the line-and-space pattern 26 on the calibration standard specimen 8.

Figure 3:
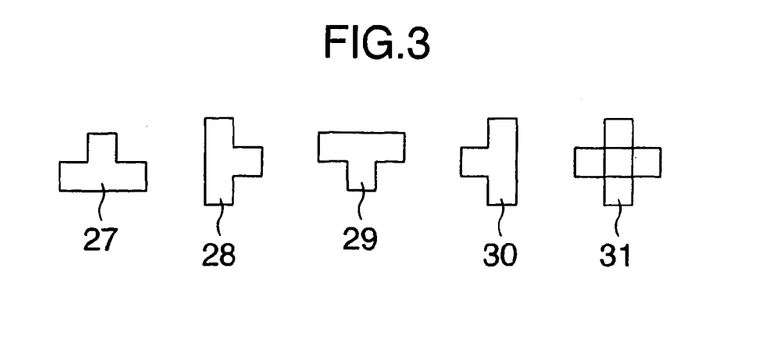
FIG. 3 is a diagram showing the construction of alignment patterns.

FIG. 3 is a diagram showing an example of the shapes of the alignment pattern. The alignment pattern takes five different kinds of shapes: inverted T-shape 27, fallen left T-shape 28, upright T-shape 29, fallen right T-shape 30 and cross-shape 31. The image produced from the scanning electron microscope is chiefly information of edges due to the edge effect that the secondary electrons are much emitted from the edges of patterns. Since the template matching is made in a two-dimensional manner, the registered template image is required to include characteristic information in both longitudinal and lateral directions. A numeric character formed near the measurement point is generally registered as a template image. For example, numerals 8 and 6 are easy to be erroneously identified because the edge characteristics are similar. Since the alignment patterns according to the invention have information of T-shapes respectively rotated 90° in turn, the information of the secondary electrons emitted from the edges has two-dimensional characteristics, thus enabling the template matching to be made with high precision. In addition, since the alignment patterns are respectively arranged near the featureless line-and-space patterns 26, any one of the patterns 26 can be distinguished from the neighboring patterns.

Figure 4:
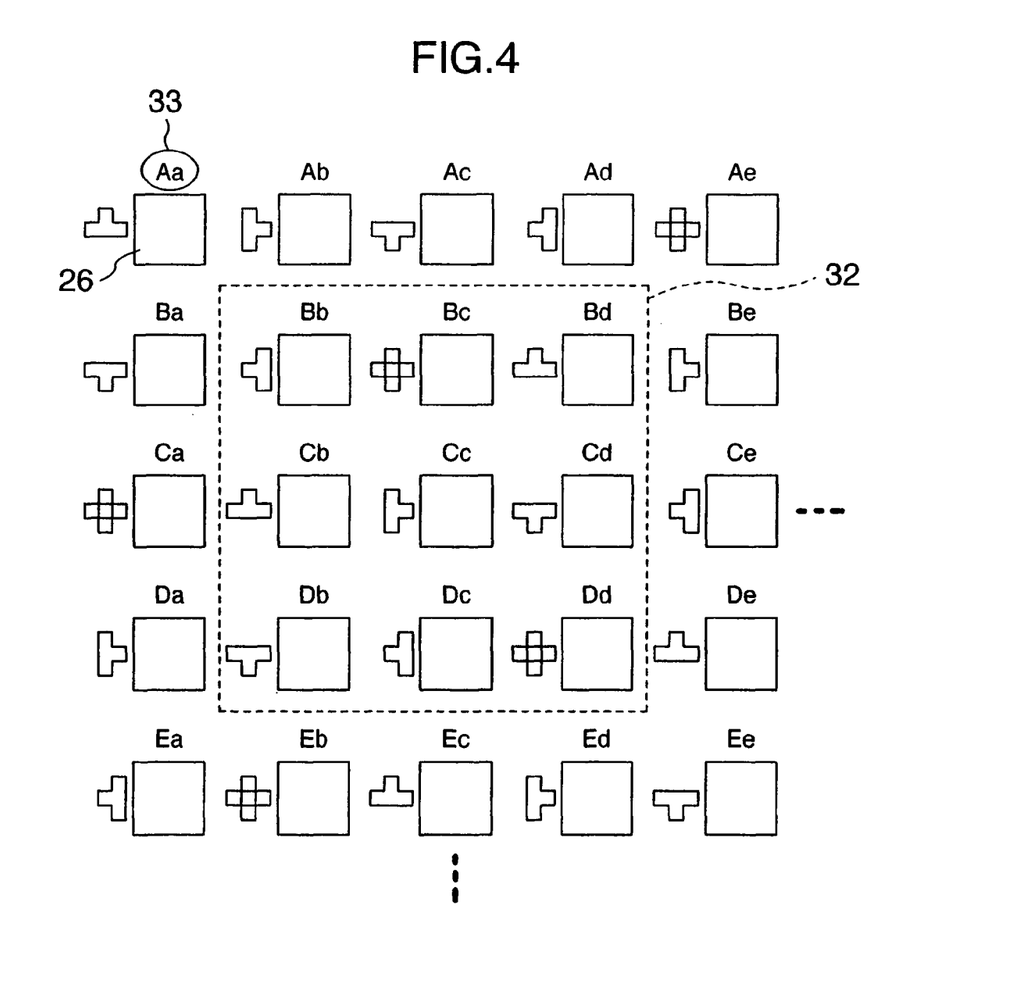
FIG. 4 is a diagram showing a method for arraying the alignment patterns.

An example of the method for arranging the above alignment patterns of five kinds will be mentioned with reference to FIG. 4. The alignment patterns of five kinds shown in FIG. 3 are arrayed in combinations to shift, for example, left by two patters for each row of pattern sections as illustrated in FIG. 4. By the arrangement of the alignment patterns in such combinations, it is possible to bring about the condition that there are no alignment patterns of the same kind between the adjacent ling-and-space patterns 26. Therefore, when the template matching is performed under a magnification of several tens of thousands, the kind of the alignment pattern at the center within a field-of-view area 32 is different from any one of the surrounding alignment patterns within the same area 32. Thus, the wrong measurement of the adjacent line-and-space patterns 26 is never caused at the time of template matching. Even if this arrangement, in which the five different alignment patterns are arrayed in combinations in the X- and Y-directions as in FIG. 4, is repeated endlessly, any one of the line-and-space patterns 26 always has a alignment pattern of a kind different from those of its neighboring line-and-space patterns. Thus, according to the above arranging method, even if an endless number of line-and-space patterns 26 are two-dimensionally arrayed in combination with the alignment patterns of such a small number of kinds as five kinds, any one of the line-and-space patterns can be distinguished from its neighboring ones. In addition, a symbol 33 for visual confirmation is formed near each of the line-and-space patterns 26.

The above embodiment has been described about an example of an array using combinations of five different alignment patterns 27~31. Thus, if the alignment patterns of more than four kinds are arranged in the same combinations as described above, any one of the line-and-space patterns 26 can be distinguished from its neighboring ones. This is because, when the template matching is performed under a magnification of several tens of thousands, the kind of the alignment pattern at the center within the field-of-view area 32 is different from any one of the surrounding alignment patterns within the same area 32.

Figure 6:
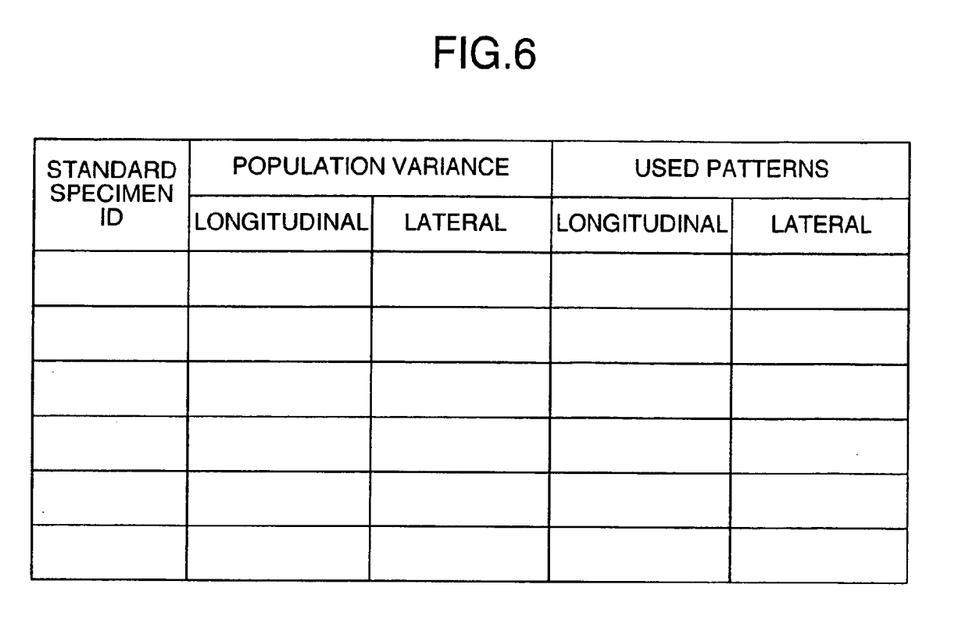
FIG. 6 is a diagram showing a table that holds information about the dimension-measurement calibration standard specimen.

The produced calibration standard specimen is previously once examined. That is, a scanning electron microscope calibrated for dimension measurement is used to previously measure all the longitudinal and lateral line-and-space patterns 26 and estimate the population variance of the measured dimensions (pitches) of the longitudinal line-and-space patterns and that of the lateral line-and-space patterns. The estimated population variances are stored in the memory 34 of the scanning electron microscope. If there are multiple calibration standard specimens, the population variances of each specimen are stored together with its ID in the table shown in FIG. 6. The used patterns will be described later.

Figure 5:
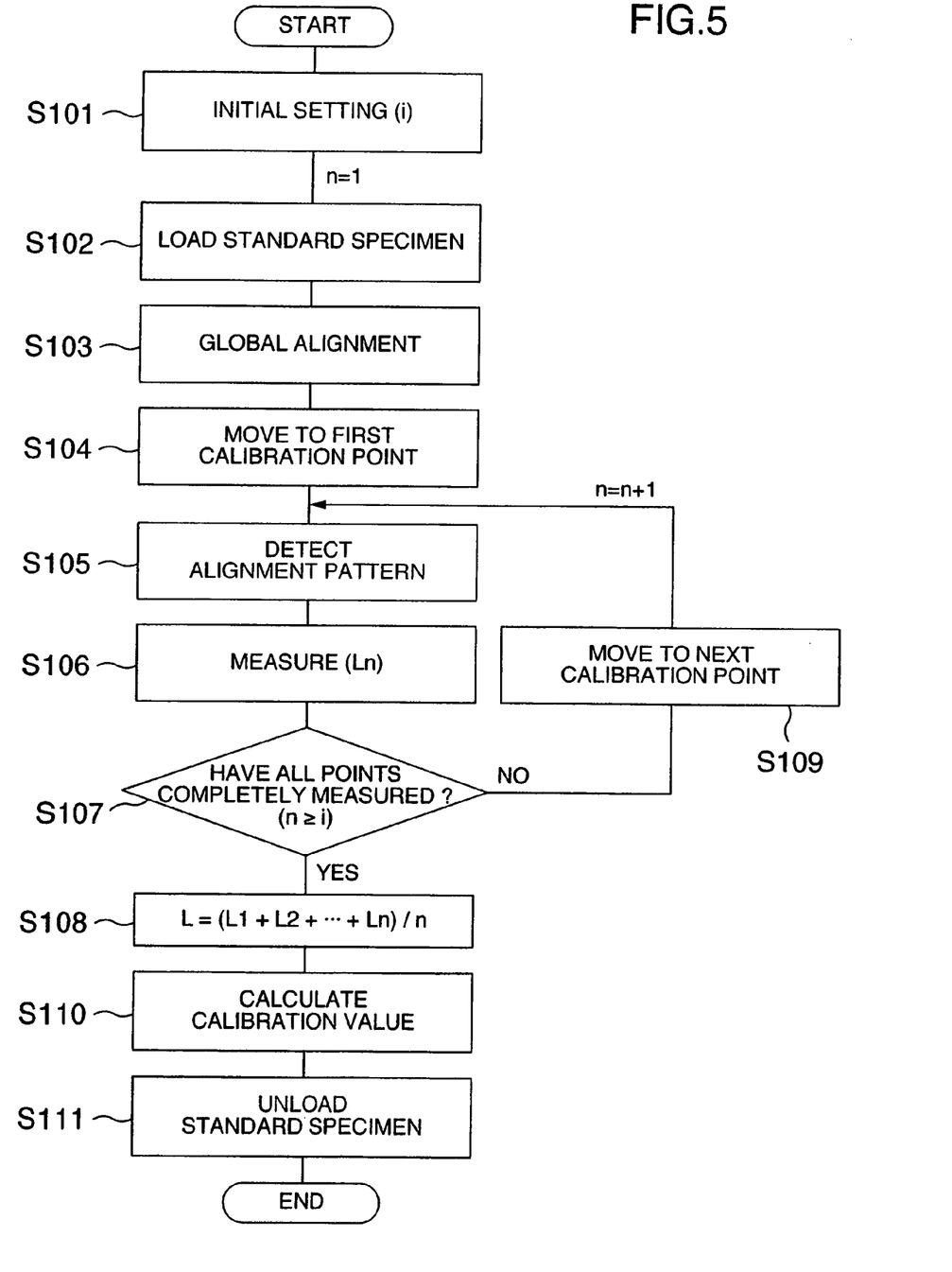
FIG. 5 is a flowchart of the operation for dimension-measurement calibration.

The operation for calibrating the dimension measurement in this invention will be explained next. FIG. 5 is a flowchart of an example of the operation for the calibration.

The precision of dimension-measurement calibration using the single calibration pattern 18 at a place is generally equal to the population variance of the calibration pattern 18. However, the presently demanded precision of dimension-measurement calibration is one nm or below, which is smaller than the population variance of the calibration pattern 18. The precision P of dimension-measurement calibration can be expressed as $$P=\sigma/\sqrt{i}$$

where $\sigma$ is the population variance of the calibration standard specimen 8, and i is the number of measurement points.

Therefore, the precision of the dimension-measurement calibration can be raised by increasing the number i of measurement points, or by measuring multiple calibration patterns 18 at a plurality of places and calibrating with the average of the obtained values. If the population variance $\sigma$ of specimen 8 and the calibration precision P are three nm and one nm, respectively, the necessary number of measurement points is nine.

The scanning electron microscope according to the invention has means that automatically makes initial setting of necessary number i of measurement points by entering the population variance $\sigma$ of specimen 8 and the necessary calibration precision P through an input device such as the mouse 20 before the specimen 8 is loaded.

Figure 7:
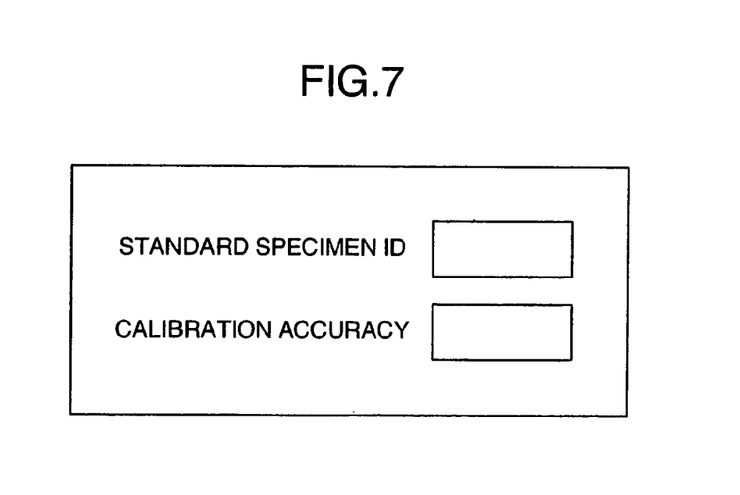
FIG. 7 is a diagram showing an example of the input screen.

In this embodiment, the operator first enters the ID of calibration standard specimen and the necessary precision of calibration through the keyboard 21 while viewing the input screen shown in FIG. 7. The scanning electron microscope searches the table of FIG. 6 stored in the memory 34 for the population variances of the pitches of the longitudinal and lateral line-and-space patterns according to the ID of calibration specimen, and computes the necessary number of measurement points, thus making the initial setting (S101). In addition, in this embodiment it is assumed that a large number of arrayed line-and-space patterns shown in FIG. 4 are measured in a previously determined order. The last used line-and-space patterns are written in the used pattern columns of the table shown in FIG. 6. The population variances of the pitches of the longitudinal and lateral line-and-space patterns of the standard specimen may be directly entered into the input screen.

Then, the user operates an input device such as mouse 20 to load the calibration standard specimen 8 into the scanning electron microscope (S102), and makes global alignment (S103). The global alignment is, for example, to detect the known multiple global alignment purpose marks 22 on the specimen 8 by an optical microscope and make translational and rotational alignment. This alignment is performed for matching the coordinate system of the specimen 8 on the sample stage 9 and the stage coordinate system of the scanning electron microscope.

Subsequently, the first calibration point is brought about to appear (S104), where the alignment patterns are detected. It is assumed that the first calibration point is the pattern next to the position at which the used pattern is registered on the table shown in FIG. 6. The detection of alignment patterns (S105) is performed to follow the calculation of the positional relation between the alignment pattern and the measurement point of calibration pattern 18 and then the progress to the measurement point. This detection is made by the template matching using the template image registered in the computer 16. The alignment pattern used at this time is any one of the patterns 27~31. After the movement to the measurement point, the calibration pattern 18 is measured (S106), and the measured value Ln is stored in the computer 16.

After the step of measurement (S106), judgment is made of whether all the patterns in predetermined places have been measured (S107). If the above condition is not met, the next calibration point is brought about to appear (S109). This operation is repeated until all the measurement points are completely processed. If the above condition is satisfied, the address of the finally measured longitudinal and lateral line-and-space patterns is written in the table of FIG. 6. Then, the specimen 8 is unloaded (S111), while the computer 16 calculates the average value L=(L1+L2+L3+ . . . +Ln)/n from the measured values (L1, L2, L3 . . . Ln) (S108), and estimates the calibration value (S110). This calibration value is used to control the deflecting current and the magnification coefficient of the measurement processor 14, thus calibrating the microscope. If multiple different microscopes are to be calibrated, the same calibration standard specimen 8 is used to calibrate each apparatus so that the machine matching can be quantitatively evaluated.

Since the line width of patterns is 100 nm or below, the scanning electron microscope that measures the critical dimensions of fine patterns formed exposed on the semiconductor wafer is demanded to have high degree of precision kept under strict calibration. According to this invention, since calibration can be made at the same position as at the time of actual measurement, the precision of the calibration in the scanning electron microscope as a single apparatus can be quantitatively grasped. The machine matching between multiple different apparatuses can also be evaluated.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope for measuring a dimension of a pattern on a specimen based on electrons emitted from the specimen, the scanning electron microscope comprising:
a processor for calibrating a measured dimension value with a calibration specimen,
wherein said processor is configured to perform implemented steps of:
forming an image based on a detected signal emitted from a field of view area, the image including a plurality of calibration pattern fields and positional alignment patterns on the calibration specimen, the calibration pattern fields each having the same pattern shape, and the positional alignment patterns having a plurality of patterns corresponding to each of the calibration pattern fields at different positions on the image, wherein shape or direction of the positional alignment patterns corresponding to the adjacent calibration pattern fields in the field of view area is different, wherein each one of the positional alignment patterns is used to distinguish a respective one of the calibration pattern fields,
executing a pattern matching algorithm which detects each one of the positional alignment patterns for identifying a predetermined calibration pattern field which corresponds to a respective one of the detected positional alignment patterns by using a template image, and
calibrating the measured dimension value with a calibration pattern of the predetermined calibration pattern field identified in the executing step.

2. A scanning electron microscope according to claim 1, wherein the processor selects a different calibration pattern from a used calibration pattern as a new calibration pattern.

3. A scanning electron microscope according to claim 2, wherein the processor registers a plurality of template images indicating different alignment patterns.

4. A scanning electron microscope according to claim 3, wherein the processor calculates an averaged measurement value based on the different calibration pattern specified by the different alignment patterns.

5. A processor for calibrating a measured value of a pattern dimension which is measured by a scanning electron microscope, wherein
the processor configured to perform the implemented steps of:
receiving image data including a plurality of calibration pattern fields and a plurality of positional alignment patterns on a calibration specimen from the scanning electron microscope, the calibration pattern fields each having the same pattern shape, and the positional alignment patterns having a plurality of patterns corresponding to each of the calibration pattern fields at different positions on the image, wherein shape or direction of the positional alignment patterns corresponding to the adjacent calibration pattern fields in a field of view area is different, wherein each one of the positional alignment patterns is used to distinguish a respective one of the calibration pattern fields,
executing a pattern matching algorithm which detects each one of the positional alignment patterns for identifying a predetermined calibration pattern field which corresponds to a respective one of the detected positional alignment patterns by using a template image, and
calibrating the measured value with a calibration pattern of calibration pattern field identified by the pre-determined alignment pattern.

6. A scanning electron microscope according to claim 5, wherein the processor selects a different calibration pattern from a used calibration pattern as a new calibration pattern.

7. A scanning electron microscope according to claim 5, wherein the processor registers a plurality of template images indicating different alignment patterns.

8. A scanning electron microscope according to claim 5, wherein the processor calculates an averaged measurement value based on the different calibration pattern specified by the different alignment patterns.

9. A method for calibrating a measured value of a pattern dimension which is measured by a scanning electron microscope, the method comprising steps of:
receiving image data including a plurality of calibration pattern fields and a plurality of positional alignment patterns on a calibration specimen from the scanning electron microscope, the calibration pattern fields each having the same pattern shape, and the positional alignment patterns having a plurality of patterns corresponding to each of the calibration pattern fields at different positions on the image, wherein shape or direction of the positional alignment patterns corresponding to the adjacent calibration pattern fields in a field of view area is different, wherein each one of the positional alignment patterns is used to distinguish a respective one of the calibration pattern fields;
executing a pattern matching algorithm which detects each one of the positional alignment patterns for identifying a predetermined calibration pattern field which corresponds to a respective one of the detected positional alignment patterns by using a template image; and
calibrating the measured value with a calibration pattern of calibration pattern field identified by the pre-determined alignment pattern.

10. The method according to claim 9, further comprising:
selecting a different calibration pattern from a used calibration pattern as a new calibration pattern.

11. The method according to claim 9, further comprising:
registering a plurality of template images indicating different alignment patterns.

12. The method according to claim 9, further comprising:
calculating an averaged measurement value based on the different calibration pattern specified by the different alignment patterns.

* * * * *

UNITED STATES PATENT AND TRADEMARK OFFICE
CERTIFICATE OF CORRECTION

PATENT NO.       : 8,399,832 B2
APPLICATION NO.  : 12/216136
DATED            : March 19, 2013
INVENTOR(S)      : Takeshi Mizuno et al.

It is certified that error appears in the above-identified patent and that said Letters Patent is hereby corrected as shown below:

Title page, in Item "(73) Assignee", the assignee should read
--Hitachi High-Technologies Corporation-- rather than "Hitachi High-Technologies".

Signed and Sealed this
Twenty-fifth Day of February, 2014

Michelle K. Lee
*Deputy Director of the United States Patent and Trademark Office*